United States Patent
King et al.

(10) Patent No.: US 7,064,067 B1
(45) Date of Patent: Jun. 20, 2006

(54) REDUCTION OF LATERAL SILICIDE GROWTH IN INTEGRATED CIRCUIT TECHNOLOGY

(75) Inventors: Paul L. King, Mountain View, CA (US); Simon Siu-Sing Chan, Saratoga, CA (US); Jeffrey P. Patton, Santa Clara, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 156 days.

(21) Appl. No.: 10/770,905

(22) Filed: Feb. 2, 2004

(51) Int. Cl.
*H01L 21/336* (2006.01)
*H01L 21/44* (2006.01)

(52) U.S. Cl. ............ 438/682; 438/299; 438/663; 438/664

(58) Field of Classification Search ........ 438/197, 438/299, 584, 660, 663, 664, 682, 683
See application file for complete search history.

(56) References Cited

U.S. PATENT DOCUMENTS

| 6,083,847 | A  | * | 7/2000 | Kuo ........................ 438/745 |
| 6,603,180 | B1 | * | 8/2003 | Gardner et al. ............ 257/382 |
| 6,797,593 | B1 | * | 9/2004 | Chakravarthi et al. ...... 438/514 |
| 6,864,143 | B1 | * | 3/2005 | Shue et al. ................ 438/299 |

* cited by examiner

*Primary Examiner*—Scott Geyer
(74) *Attorney, Agent, or Firm*—Mikio Ishimaru

(57) ABSTRACT

A method of forming an integrated circuit with a semiconductor substrate is provided. A gate dielectric is formed on the semiconductor substrate, and a gate is formed on the gate dielectric. A sidewall spacer is formed around the gate. Source/drain junctions are formed in the semiconductor substrate. An intermediate phase silicide is formed on the source/drain regions and on the gate. The sidewall spacer is removed. A final phase silicide is formed from the intermediate phase silicide. An interlayer dielectric is deposited above the semiconductor substrate, and contacts are then formed in the interlayer dielectric to the final phase silicide.

20 Claims, 3 Drawing Sheets

REDUCTION OF LATERAL SILICIDE GROWTH IN INTEGRATED CIRCUIT TECHNOLOGY

BACKGROUND

1. Technical Field

The present invention relates generally to semiconductor technology, and more specifically to siliciding in semiconductor devices.

2. Background Art

Electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor (CMOS) transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. The lightly doped regions of the silicon substrate are referred to as "shallow source/drain junctions," which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "S/D junctions."

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the source/drain junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow source/drain regions by ion implantation of boron or phosphorus impurity atoms into the surface of the silicon substrate. The ion implantation is followed by a high-temperature anneal above 700° C. to activate the implanted impurity atoms to form the shallow source/drain junctions.

A silicon nitride layer is deposited and etched to form sidewall spacers around the side surfaces of the gate oxides and polysilicon gates. The sidewall spacers, the gate oxides, and the polysilicon gates are used as masks for the conventional source/drain regions by ion implantation of boron or phosphorus impurity atoms into the surface of the silicon substrate into and through the shallow source/drain junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the source/drain junctions and to the polysilicon gates. The contact openings are then filled with a conductive metal and interconnected by formation of conductive wires in other interlayer dielectric (ILD) layers.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$) and titanium silicide ($TiSi_2$).

The suicides are formed by first applying a thin layer of the cobalt or titanium on the silicon substrate above the source/drain junctions and the polysilicon gates. The semiconductor wafer is subjected to one or more annealing steps at temperatures above 800° C. and this causes the cobalt or titanium to selectively react with the silicon and the polysilicon to form the metal silicide. The process is generally referred to as "siliciding." Since the shallow trench oxide and the sidewall spacers will not react to form a silicide, the suicides are aligned over the source/drain junctions and the polysilicon gates so the process is also referred to as "self-aligned siliciding," or "saliciding."

However, existing siliciding and saliciding have not succeeded in solving all the problems related to connecting metal contacts to silicon.

The problems include, but are not limited to, lateral growth of the silicide under the sidewall spacer causing increased transistor leakage current and, in some cases, short circuits in the transistors.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on the semiconductor substrate, and a gate is formed on the gate dielectric. A sidewall spacer is formed around the gate. Source/drain junctions are formed in the semiconductor substrate. An intermediate phase silicide is formed on the source/drain regions and on the gate. The sidewall spacer is removed. A final phase silicide is formed from the intermediate phase silicide. An interlayer dielectric is deposited above the semiconductor substrate, and contacts are then formed to the final phase silicide.

This method significantly lowers the electrical resistance between the contacts and the silicon or polysilicon greatly improving performance of the integrated circuit.

The present invention also reduces the lateral growth of the silicide under the gate thereby reducing transistor leakage current and electrical short circuits.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
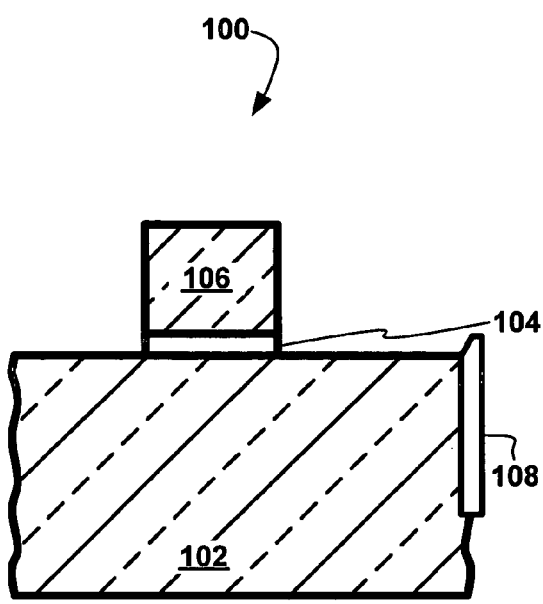
FIG. 1 is a view of a transistor in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a transistor 100 in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation (STI) 108.

Figure 2:
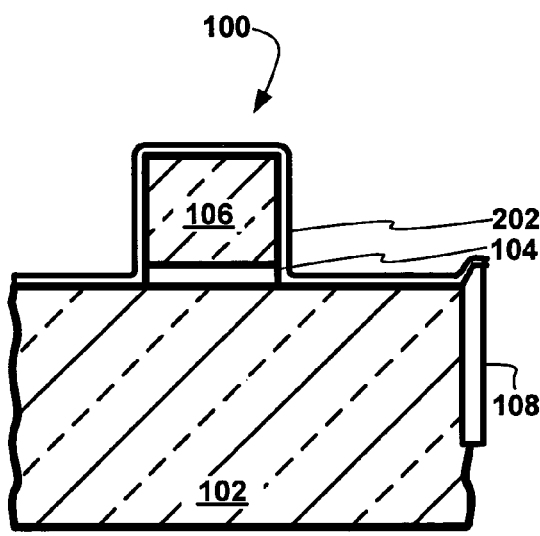
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
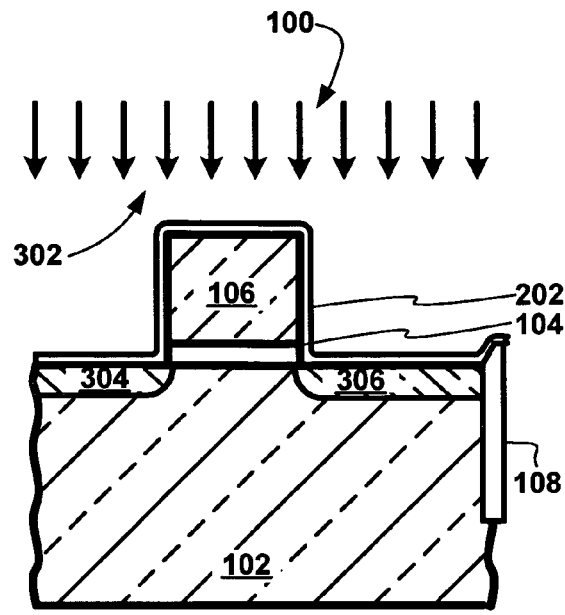
FIG. 3 is the structure of FIG. 2 during ion implantation to form shallow source/drain junctions.

Referring now to FIG. 3, therein is shown the structure of FIG. 2 during an ion implantation 302 to form shallow source/drain junctions 304 and 306.

The gate 106 and the gate dielectric 104 act as masks for the formation of shallow source/drain junctions 304 and 306 by the ion implantation 302 of boron (B) or phosphorus (P) impurity atoms into the surface of the semiconductor substrate 102. The ion implantation 302 is followed by a high-temperature anneal above 700° C. to activate the implanted impurity atoms to form the shallow source/drain junctions 304 and 306.

Figure 4:
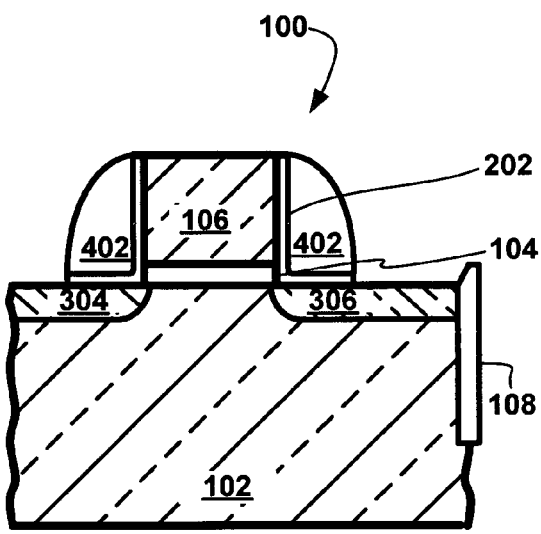
FIG. 4 is the structure of FIG. 3 after formation of a sidewall spacer.

Referring now to FIG. 4, therein is shown the structure of FIG. 3 after formation of a curved sidewall spacer 402.

The sidewall spacer 402 is formed over the liner layer 202 by forming a layer, generally of silicon nitride, which has been deposited and etched to form the curved shape of the sidewall spacer 402. The portion of the liner layer 202 not covered by the sidewall spacer 402 is removed, such as by etching.

Figure 5:
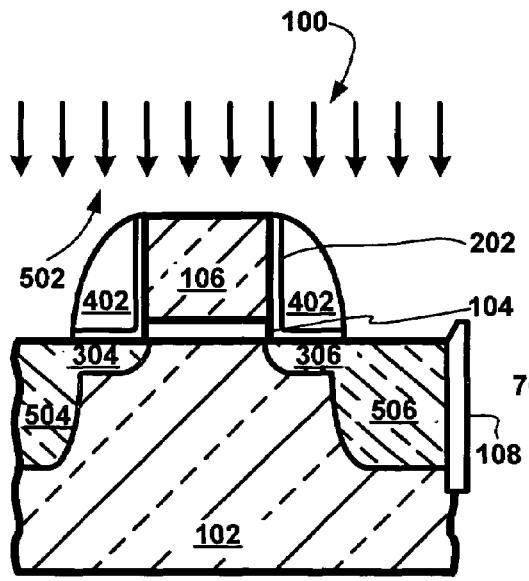
FIG. 5 is the structure of FIG. 4 during ion implantation to form deep source/drain junctions.

Referring now to FIG. 5, therein is shown the structure of FIG. 4 during an ion implantation 502 to form deep source/drain junctions 504 and 506.

The sidewall spacer 402, the gate 106, and the STI 108, act as masks for the formation of the deep source/drain junctions 504 and 506 by the ion implantation 502 of boron or phosphorus impurity atoms into the surface of the semiconductor substrate 102 and into and through the shallow source/drain junctions 304 and 306, respectively. The ion implantation 502 is again followed by a high-temperature anneal above 700° C. to activate the implanted impurity atoms to form the source/drain junctions 504 and 506.

Figure 6:
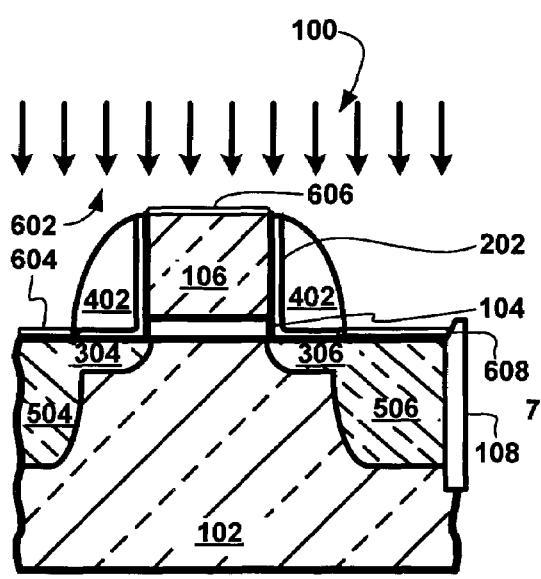
FIG. 6 is the structure of FIG. 5 during the formation of intermediate phase silicide.

Referring now to FIG. 6, therein is shown a deposition process 602 used in the formation of intermediate phase silicide 604, 606, and 608 in accordance with the present invention. The intermediate phase silicide 604 and 608 are formed with the surface of the semiconductor substrate 102 over the deep source/drain junctions 504 and 506, respectively, and the intermediate phase silicide 606 is formed on the gate 106.

The silicide 604, 606, 608 preferably is formed of a metal selected from the group consisting of cobalt, titanium, nickel, arsenic doped nickel, an alloy thereof, a compound thereof, and a combination thereof.

Generally, there are three ways in which to form a silicide. In one technique, the deposition process 602 deposits a pure metal on exposed silicon areas (both single crystalline and polycrystalline silicon). Thereafter, the metal is reacted with the silicon to form what is known as a first phase, metal-rich silicide. The non-reacted metal is then removed, and the pre-existing first phase product is then reacted again with the underlying silicon to form a second phase, silicon-rich silicide. In a second technique, the deposition process 602 involves co-evaporation of both metal and silicon onto the exposed silicon. Both metal and silicon are vaporized by, for example, an electron beam. The vapor is then drawn onto the wafer and across the silicon. In a third technique, the deposition process 602 involves co-sputtering both metal and silicon onto the silicon surface. Co-sputtering entails physically dislodging metal and silicon materials from a composite target or separate targets, and then directing the composite material onto the wafer.

Conventional salicidation processes have become problematic with modern semiconductor devices that have shallow source/drain junctions, e.g., junction depths less than 1000 Angstroms (Å). In particular, during such salicidation processes, some of the existing source/drain regions are consumed. For example, when cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain junctions and may adversely impact the electrical performance characteristics of the source/drain junctions, and ultimately, degrades the performance of the integrated circuit.

An intermediate phase silicide 604, 606, and 608 is formed by depositing a transition metal layer, such as a transition metal selected from at least one of cobalt, titanium, nickel, arsenic doped nickel, an alloy thereof, a compound thereof, or a combination thereof. The transition metal layer is processed using a low temperature anneal to convert the transition metal to the intermediate phase silicide 604, 606, and 608. The time and temperature of that anneal is dependent on the metal being used. The portion of the transition metal that has not reacted with the semiconductor substrate 102 or the gate 106 is then removed, such as by a wet or dry etch of the unreacted transition metal.

While the present invention may be used with various refractory metal suicides, it is described here for nickel silicide. Although nickel silicide has the advantage of low silicon consumption, a significant failure mechanism arises from growth of nickel silicide below the sidewall spacer 402 leading to transistor leakage current and electrical short circuits. This undesirable lateral growth of silicide under the spacer is referred to as silicide "piping".

It has further been discovered that removal of the sidewall spacer 402 relieves stresses that occur at the interface between the liner layer 202 and the semiconductor substrate 102 thereby reducing the amount of lateral growth under the liner layer 202, during the formation of the final phase silicide 704, 706, and 708. This reduces transistor leakage current and electrical short circuits. Removal of the spacer can take place either prior to metal deposition or after the intermediate phase of the silicide has been formed and unreacted metal stripped but must occur prior to the formation of the final silicide phase.

Figure 7:
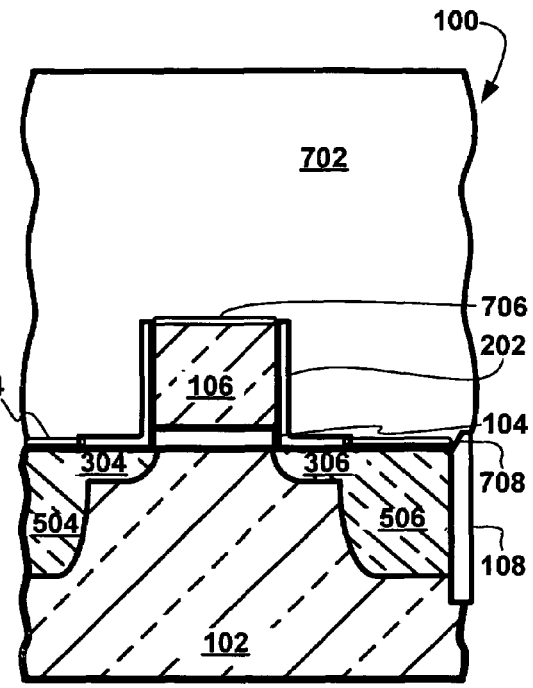
FIG. 7 is the structure of FIG. 6 after removal of the sidewall spacer, formation of final stage silicide, and formation of an interlayer dielectric over the final stage silicide and the shallow trench isolation.

Referring now to FIG. 7 therein is shown the structure of FIG. 6 after removal of the sidewall spacer 402. The sidewall spacer 402 is removed by etching, for example, if the sidewall spacer 402 is a nitride, it can be removed by etching with phosphoric acid, or other suitable etchant. Etching of the sidewall spacer 402 does not substantially affect the intermediate phase silicide 604, 606, and 608 shown in FIG. 6. The intermediate phase silicide 604, 606, and 608 shown in FIG. 6 is then processed using a high temperature rapid thermal anneal (RTA) process to convert the intermediate phase silicide 604, 606, and 608 to a final phase silicide 704, 706, and 708.

For example, the intermediate phase silicide 604, 606, and 608 in a cobalt silicide system is CoSi where the rapid thermal anneal converts this to the final phase silicide 704, 706, and 708 of $CoSi_2$. In a nickel silicide system the intermediate phase silicide 604, 606, and 608 is $Ni_2Si$ and the final phase silicide is NiSi.

It has been discovered that the present invention reduces or eliminates the possibility of formation of some silicide on the spacer itself, which would create a short circuit in the integrated circuit.

After removal of the sidewall spacer 402 and formation of the final phase silicide a dielectric layer 702 is formed over the final phase silicide layers 704, 706, and 708, and the STI 108.

In various embodiments, the dielectric layer 702 is of dielectric materials such as silicon oxide ($SiO_x$), tetraethylorthosilicate (TEOS), borophosphosilicate (BPSG) glass, etc. with medium dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc. with dielectric constants below 3.9 to 2.5. Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 8:
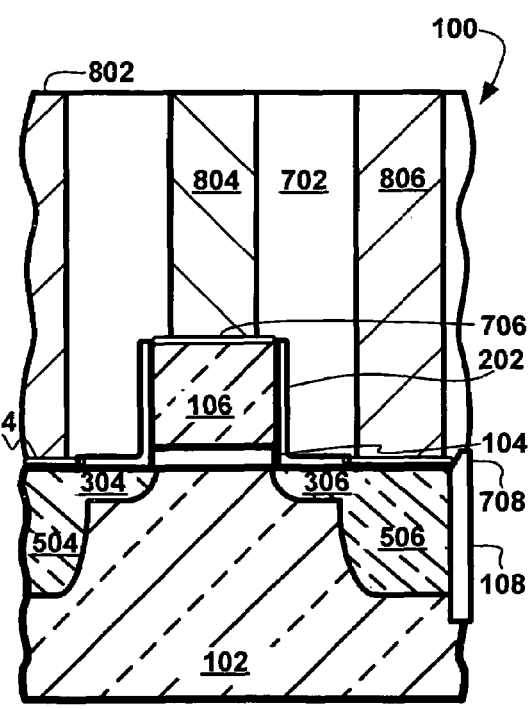
FIG. 8 is the structure of FIG. 7 after formation of metal contacts.

Referring now to FIG. 8, therein is shown the structure of FIG. 7 after formation of metal contacts 802, 804, and 806.

The metal contacts 802, 804, and 806 are respectively electrically connected to the final phase silicide layers 704, 706, and 708 and respectively to the deep source/drain junction 504, the gate 106, and the deep source/drain junction 506.

In various embodiments, the metal contacts 802, 804, and 806 are of metals such as at least one of tantalum (Ta), titanium (Ti), tungsten (W), alloys thereof, or compounds thereof. In other embodiments, the metal contacts 802, 804, and 806 are of metals such as copper (Cu), gold (Au), silver (Ag), alloys thereof, and compounds thereof with one or more of the above elements with diffusion barriers around them.

Figure 9:
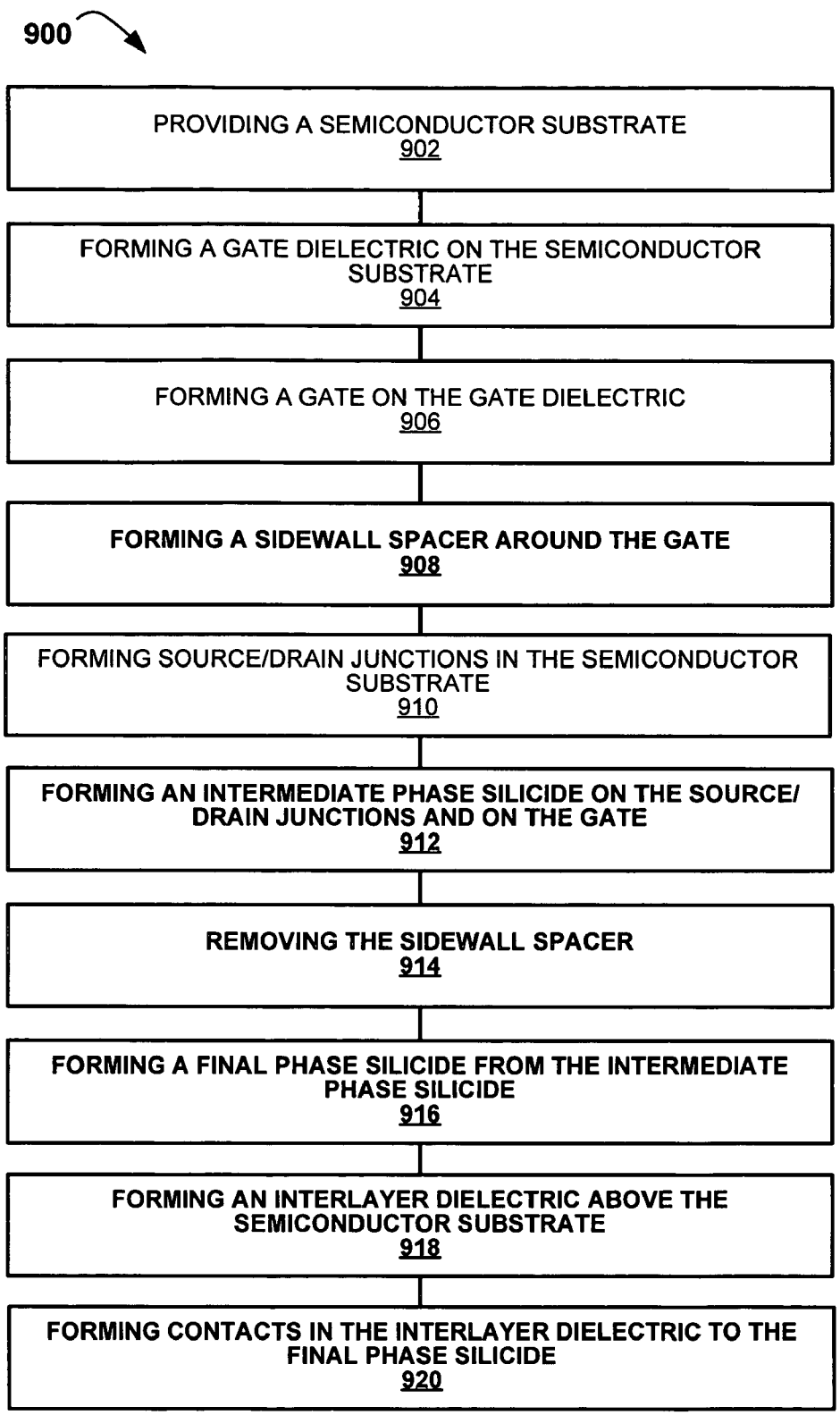
FIG. 9 is a simplified flow chart of the method of manufacturing the silicide in accordance with the present invention.

Referring now to FIG. 9, therein is shown a simplified flow chart of a method 900 in accordance with the present invention. The method 900 includes: providing a semiconductor substrate in a step 902; forming a gate dielectric on the semiconductor substrate in a step 904; forming a gate on the gate dielectric in a step 906; forming a sidewall spacer around the gate in a step 908; forming source/drain junctions in the semiconductor substrate in a step 910; forming an intermediate phase silicide on the source/drain junctions and on the gate in a step 912; removing the sidewall spacer in a step 914; forming a final phase silicide from the intermediate phase silicide in a step 916; forming an interlayer dielectric above the semiconductor substrate in a step 918; and forming contacts in the interlayer dielectric to the final phase silicide in a step 920.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. A method of forming an integrated circuit comprising:
   providing a semiconductor substrate;
   forming a gate dielectric on the semiconductor substrate;
   forming a gate on the gate dielectric;
   forming a sidewall spacer around the gate;
   forming source/drain junctions in the semiconductor substrate;
   forming an intermediate phase silicide on the source/drain junctions and on the gate;
   removing the sidewall spacer prior to forming a final phase silicide from the intermediate phase silicide;
   forming an interlayer dielectric above the semiconductor substrate; and
   forming contacts in the interlayer dielectric to the final phase silicide.

2. The method as claimed in claim 1 wherein:
   forming the sidewall spacer forms a liner layer under the sidewall spacer.

3. The method as claimed in claim 1 wherein:
   forming the intermediate phase silicide uses a low temperature anneal.

4. The method as claimed in claim 1 wherein:
   forming the final phase silicide uses a high temperature rapid thermal anneal.

5. The method as claimed in claim 1 wherein:
   forming the contacts uses materials selected from at least one of tantalum, titanium, tungsten, copper, gold, silver, an alloy thereof, a compound thereof, and a combination thereof.

6. The method as claimed in claim 1 wherein:
   forming the intermediate phase silicide forms a metal silicide using a transition metal selected from at least one of cobalt, titanium, nickel, arsenic doped nickel, an alloy thereof, a compound thereof, and a combination thereof.

7. A method of reducing piping of a suicide formed over source/drain junctions in an integrated circuit having a gate comprising:
   forming a sidewall spacer around the gate;
   forming the source/drain junctions in the semiconductor substrate;
   forming an intermediate phase silicide on the source/drain junctions and on the gate; and
   removing the sidewall spacer prior to forming a final phase suicide from the intermediate phase silicide.

8. The method as claimed in claim 7 wherein:
   forming the sidewall spacer forms a liner layer under the sidewall spacer.

9. The method as claimed in claim 7 wherein:
   forming the intermediate phase silicide uses a low temperature anneal.

10. The method as claimed in claim 7 wherein:
    forming the final phase silicide uses a high temperature rapid thermal anneal.

11. The method as claimed in claim 7 wherein:
    forming the intermediate phase silicide forms a metal silicide using a transition metal selected from at least one of cobalt, titanium, nickel, arsenic doped nickel, an alloy thereof, a compound thereof, and a combination thereof.

12. A method of reducing stress in the area of a semiconductor substrate around a gate comprising:
    forming a sidewall spacer around the gate;
    forming the source/drain junctions in the semiconductor substrate;
    forming an intermediate phase silicide on the source/drain junctions and on the gate; and
    removing the sidewall spacer prior to forming a final phase silicide from the intermediate phase silicide.

13. The method as claimed in claim 12 wherein:
    forming the sidewall spacer forms a liner layer under the sidewall spacer.

14. The method as claimed in claim 12 wherein:
    forming the intermediate phase silicide uses a low temperature anneal.

15. The method as claimed in claim 12 wherein:
    forming the final phase silicide uses a high temperature rapid thermal anneal.

16. The method as claimed in claim 12 wherein:
    forming the intermediate phase silicide forms a metal silicide using a transition metal selected from at least one of cobalt, titanium, nickel, arsenic doped nickel, an alloy thereof, a compound thereof, and a combination thereof.

17. A method of forming a silicide in an integrated circuit having a spacer around a gate comprising:
    forming an intermediate phase silicide layer around the spacer; and removing the spacer prior to forming a final phase silicide form the intermediate phase silicide.

18. The method as claimed in claim 17 wherein:
    forming the intermediate phase silicide uses a low temperature anneal.

19. The method as claimed in claim 17 wherein:
    forming the final phase silicide uses a high temperature rapid thermal anneal.

20. The method as claimed in claim 17 wherein:
    forming the intermediate phase silicide forms a metal silicide using a transition metal selected from at least one of cobalt, titanium, nickel, arsenic doped nickel, an alloy thereof, a compound thereof, and a combination thereof.

* * * * *

UNITED STATES PATENT AND TRADEMARK OFFICE
CERTIFICATE OF CORRECTION

PATENT NO. : 7,064,067 B1 Page 1 of 1
APPLICATION NO. : 10/770905
DATED : June 20, 2006
INVENTOR(S) : King et al.

It is certified that error appears in the above-identified patent and that said Letters Patent is hereby corrected as shown below:

Column 2
   Line 31, delete "suicides" and insert therefor --silicides--
   Line 40, delete "suicides" and insert therefor --silicides--

Column 5
   Line 31, delete "suicides," and insert therefor --silicides,--

Column 7
   Claim 7, line 37, delete "suicide" and insert therefor --silicide--
   Claim 7, line 46, delete "suicide" and insert therefor --silicide--

Column 8
   Claim 17, line 38, delete "form" and insert therefor --from--

Signed and Sealed this

Fifteenth Day of August, 2006

JON W. DUDAS
*Director of the United States Patent and Trademark Office*